United States Patent
Kobayashi et al.

[11] Patent Number: 5,448,494
[45] Date of Patent: Sep. 5, 1995

[54] MASK DATA PROCESSING APPARATUS FOR INTEGRATED CIRCUIT PRODUCTION

[75] Inventors: Kenichi Kobayashi, Tokyo; Masahiro Yumoto, Machida; Nobuyasu Horiuchi, Tokyo; Akihiro Okazaki, Kawasaki; Hiroshi Fuji; Hiroaki Tsuda, both of Tokyo, all of Japan

[73] Assignees: Fujitsu Limited, Kawasaki; Japan Control Systems, Inc., Tokyo, both of Japan

[21] Appl. No.: 180,498

[22] Filed: Jan. 12, 1994

Related U.S. Application Data

[63] Continuation of Ser. No. 630,665, Dec. 20, 1990, abandoned.

[30] Foreign Application Priority Data

| Dec. 20, 1989 | [JP] | Japan | 1-330440 |
| Dec. 26, 1989 | [JP] | Japan | 1-340968 |
| Dec. 26, 1989 | [JP] | Japan | 1-340983 |
| Dec. 26, 1989 | [JP] | Japan | 1-340984 |
| Dec. 26, 1989 | [JP] | Japan | 1-340985 |
| Dec. 26, 1989 | [JP] | Japan | 1-340986 |

[51] Int. Cl.$^6$ .............................. G06F 17/50
[52] U.S. Cl. ............................. 364/489; 364/488; 250/492.22
[58] Field of Search ............. 364/488, 489, 490, 491; 250/492.22

[56] References Cited

U.S. PATENT DOCUMENTS

| 4,580,228 | 4/1986  | Noto .................... 364/491 |
| 4,584,653 | 4/1986  | Chih et al. ............. 364/491 |
| 4,815,003 | 3/1989  | Putatunda et al. ....... 364/491 |
| 4,922,432 | 5/1990  | Kobayashi et al. ...... 364/490 |
| 5,062,054 | 10/1991 | Kawakami et al. ...... 364/491 |
| 5,097,422 | 3/1992  | Corbin, II et al. ...... 364/490 |
| 5,253,182 | 10/1993 | Suzuki ................. 364/489 |
| 5,337,247 | 8/1994  | Hamaguchi ............. 364/490 |
| 5,349,197 | 9/1994  | Sakamoto et al. ....... 250/492.22 |

FOREIGN PATENT DOCUMENTS 59-225474 12/1984 Japan .................... 395/163

*Primary Examiner*—Vincent N. Trans
*Attorney, Agent, or Firm*—Staas & Halsey

[57] ABSTRACT

An apparatus for mask data processing in which a design data format of computer aided design for an integrated circuit is transformed into mask data of an actual integrated circuit. The apparatus includes a data transformation unit for transforming a design data format of computer aided design for an integrated circuit into mask data of an actual integrated circuit, and a picture image display unit for monitoring the transformation of the design data format into the mask data. The data transformation unit includes a control central processor unit for controlling the mask data transformation, and a picture processing processor having a calculation central processor unit for a unit field.

7 Claims, 12 Drawing Sheets

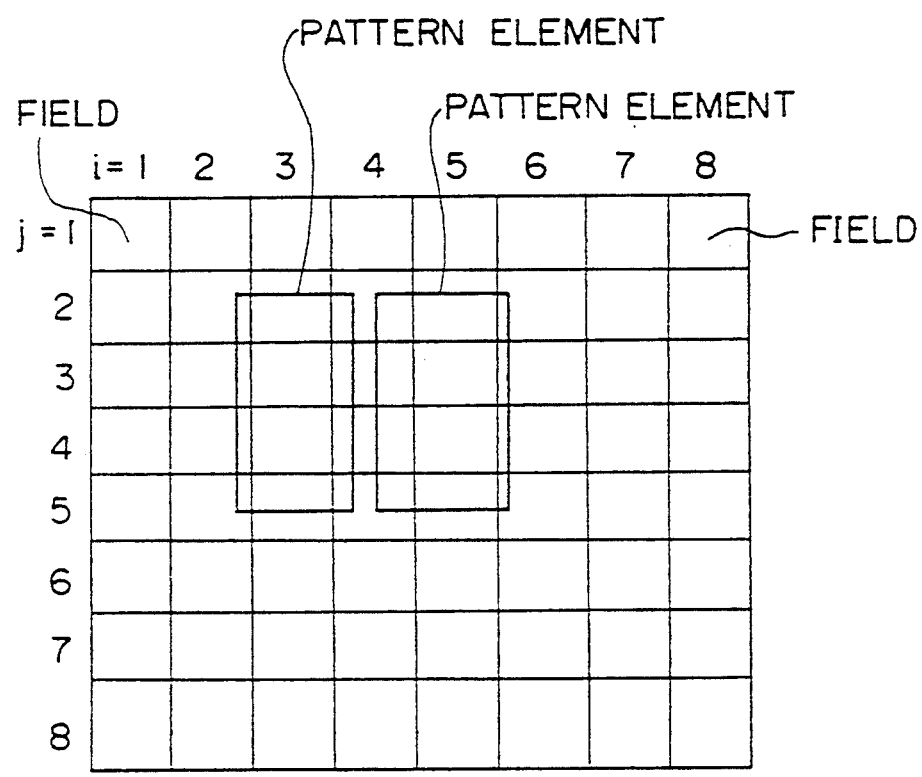

Fig. 13

| NAME | | |
|---|---|---|
| 0 | A | pattern width, distance |
| 1 | A | pattern distance |
| 2 | A | pattern width |
| 3 | B | pattern width, distance |
| 4 | B | pattern distance |
| 5 | B | pattern width |
| 6 | A inside B | pattern width, distance |
| 7 | A inside B | pattern distance |
| 8 | A inside B | pattern width |
| 9 | A outside B | pattern width, distance |
| 10 | A outside B | pattern distance |
| 11 | A outside B | pattern width |
| 12 | B outside A | pattern width, distance |
| 13 | B outside A | pattern distance |
| 14 | B outside A | pattern width |
| 15 | A include B | pattern width, distance |
| 16 | A include B | pattern distance |
| 17 | A include B | pattern width |
| 18 | A different B | pattern width, distance |
| 21 | Disable | |

RULE-1 :

THIS PORTION IS SAME AS SET UP PICTURE

ASK DATA PROCESSING APPARATUS FOR INTEGRATED CIRCUIT PRODUCTION

This application is a continuation of application No. 07/630,665, filed Dec. 20, 1990, now abandoned.

BACKGROUND OF THE INVENTION

1. Field of Invention

The present invention relates to a mask data processing apparatus for integrated circuit production. The apparatus according to the present invention can be used in the case where the design data for a semiconductor integrated circuit device is obtained by logic design, circuit design, pattern design, and computer aided design to produce a mask pattern, and production data for the semiconductor integrated circuit device for providing exposure data is obtained subsequently by transforming the above-mentioned design data. The exposure is an exposure by light, laser, X-ray, electron beam, or the like.

2. Description of the Related Arts

In general, design data for a semiconductor integrated circuit device produced by computer aided design (CAD) is transformed into production data by using a single central processor unit (CPU). Both the function of a high speed data channel which is important for data exchange and the function of a high speed calculation which is important for data transformation are required for the single CPU.

In the transformation of the CAD design data into the production data, a production data format, e.g., MEBES, KLARIS, and the like, is used.

It has been recognized to be necessary that a pattern change in the format transformation process be inspected to check whether any defects are caused in the format transformation process.

However, in the prior art, there is a problem that such duplicate functions required for the single CPU tends to restrict the ability of the CPU and cause a deterioration in the efficiency of the data transformation and an increase in processing time.

Also, in the prior art, there is a problem that the selective inspection of how a specific pattern in a desired region of the device is changed by a process, e.g., a logic processing, a sizing process, and the like, cannot be carried out.

SUMMARY OF THE INVENTION

It is an object of the present invention to provide an improved mask data processing apparatus for integrated circuit production in which a control CPU for controlling the transformation of the mask data and a calculation CPU for controlling the calculation and the pattern processing are separated and hierarchically arranged to enhance the efficiency of the mask data transformation and reduce the processing time.

It is another object of the present invention to provide an improved mask data processing apparatus for integrated circuit production in which a specific pattern in a desired region of the device is selectively displayed in a video representation to facilitate the inspection of the change of the pattern in the format transformation process.

According to the present invention, there is provided an apparatus for mask data processing in which a design data format of computer aided design for an integrated circuit is transformed into mask data of an actual integrated circuit, the apparatus including a data transformation unit for transforming a design data format of computer aided design for an integrated circuit into mask data of an actual integrated circuit, and a picture image display unit for monitoring the transformation of the design data format into the mask data. The data transformation unit includes a control central processor unit for controlling the mask data transformation, and a picture processing processor having a calculation central processor unit for a unit field.

According to the present invention, there is also provided an apparatus for mask data processing in which a design data format of computer aided design for an integrated circuit is transformed into mask data of an actual integrated circuit, the apparatus including a data transformation unit for transforming a design data format of computer aided design for an integrated circuit into mask data of an actual integrated circuit, and a picture image display unit for monitoring the transformation of the design data format into the mask data.

The picture image display unit is adapted to display in a video representation a process of the transformation of the design data format into the mask data.

BRIEF DESCRIPTION OF THE DRAWINGS

In the drawings,

FIG. 3 shows an example of an arrangement of the fields on which the pattern elements are located;

FIG. 13 shows an example of the display of the rule menu for the operation of the picture image forming circuit.

DESCRIPTION OF THE PREFERRED EMBODIMENT

Before describing the preferred embodiments of the present invention, the system of the transformation of a design data format of computer aided design (CAD) for an integrated circuit into mask data of an actual integrated circuit to which the present invention is applied will be explained with reference to FIGS. 1, 2, 3, 4A, 4B and 4C.

Figure 1:
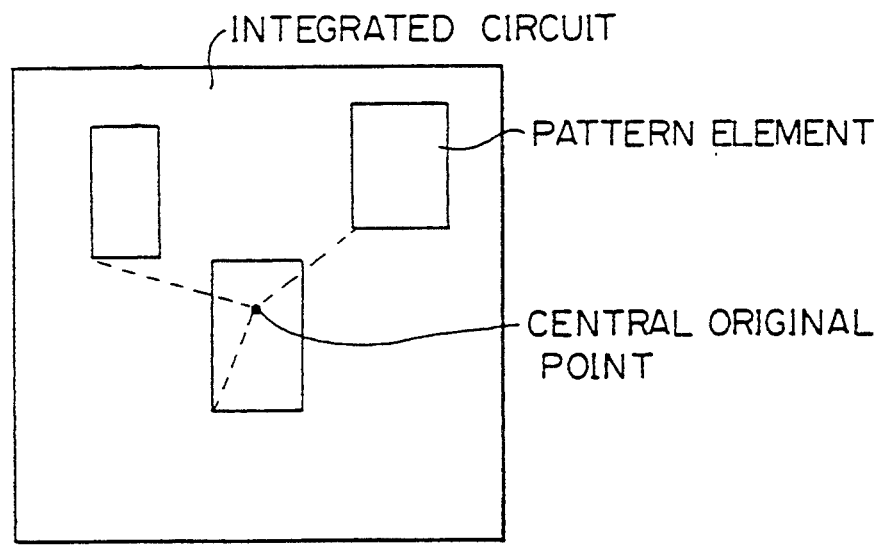
FIG. 1 shows an example of a semiconductor integrated circuit device for which the apparatus of the present invention is used.

An example of a semiconductor integrated circuit device having an arrangement of pattern elements is shown in FIG. 1. The size of the substrate is, for example, 10 mm×10 mm. The design data for the integrated circuit of FIG. 1 is obtained by the logic design, circuit design, pattern design, and computer aided design. For example, the data of the pattern elements in the integrated circuit is expressed by the numerals representing the coordinates of the original point of each pattern element with regard to the central original point and the numerals representing the length and the widths of each pattern element.

Figure 2:
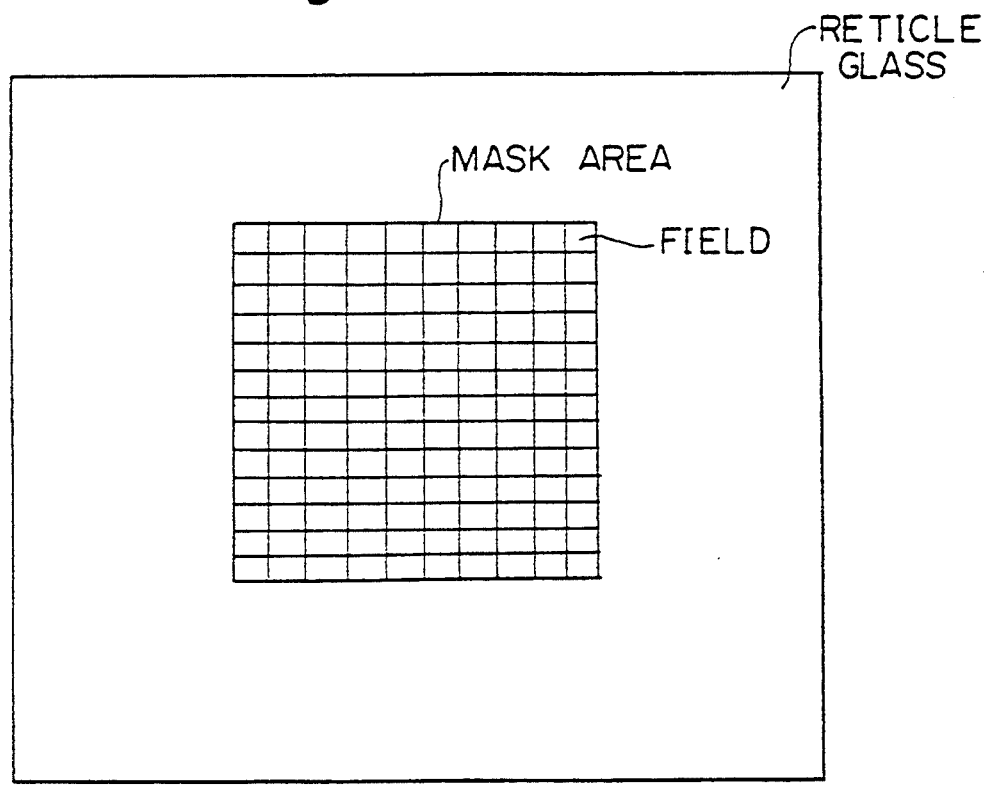
FIG. 2 shows an example of a reticule glass used for the production of the semiconductor integrated circuit device.

To produce the semiconductor integrated circuit shown in FIG. 1, a reticle glass shown in FIG. 2 is used as the original plate for the mask pattern. The size of the reticle glass is, for example, 100 mm×100 mm. On the reticle glass, the mask area having the size of, for example, 50 mm×50 mm is provided. The mask area is divided into a lattice like plurality of unit areas, and this unit area is called a field.

An example of the arrangement of the fields on which the pattern elements are located is shown in FIG. 3. The arrangement of the fields is represented, for example, by the column number $i=1, 2, 3, \ldots 8$, and the row number $j=1, 2, 3, \ldots 8$.

Figure 4A:
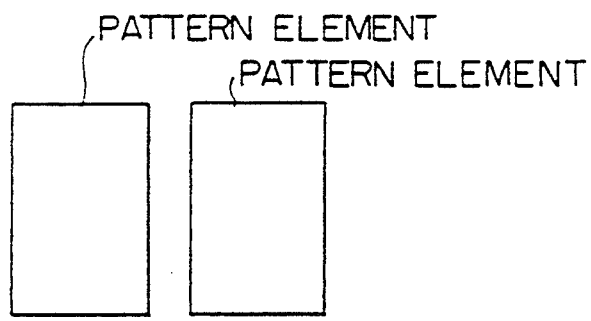
FIGS. 4A, 4B and 4C illustrate an example of the process of the sizing of the pattern elements.
Figure 4B:
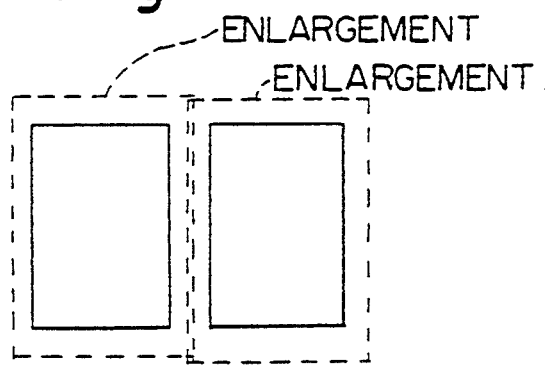
Figure 4C:
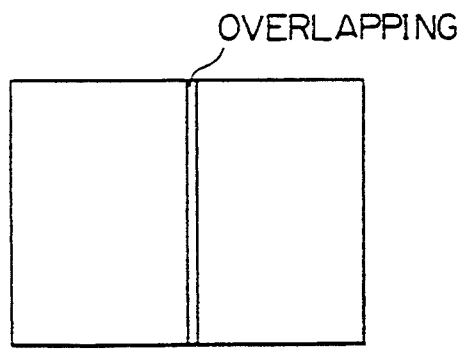

One of the problems in the prior art format transformation is explained with reference to FIGS. 4A, 4B and 4C which illustrate the process of the sizing of the pattern elements. In the sizing process, when two adjacent pattern elements (FIG. 4A) are enlarged (FIG. 4B), the enlarged pattern elements may cause an undesirable overlapping (FIG. 4C). Such overlapping constitutes one of the defects caused in the format transformation process, and the inspection of the pattern change for checking such defects has been recognized to be necessary.

Figure 5:
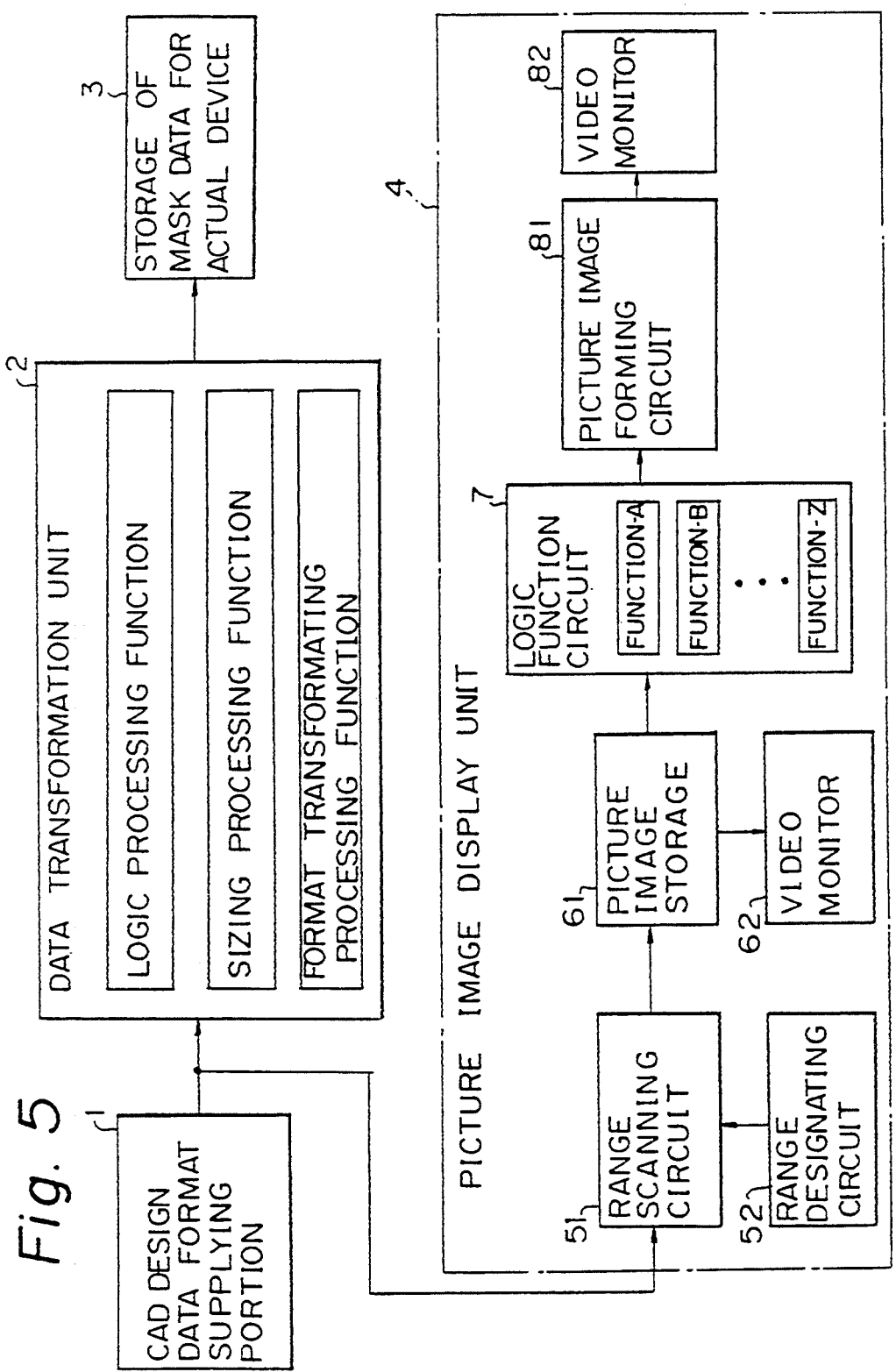
FIG. 5 is a schematic diagram of an apparatus for a mask data processing according to an embodiment of the present invention.

An apparatus for a mask data processing according to an embodiment of the present invention is shown in FIG. 5. The structure of the data transformation unit in the apparatus of FIG. 5 is shown in FIG. 6, and the detailed structure of the picture processing processor is shown in FIG. 7.

The apparatus of FIG. 5 includes a CAD design data format supplying portion 1, a data transformation unit 2, a storage for mask data for an actual device 3, and a picture image display unit 4. The picture image display unit 4 includes a range scanning circuit 51, a range designating unit 52, a picture image storage 61, a video monitor 62, a logic function portion 7, a picture image forming circuit 81, and a video monitor 82.

In the data transformation unit 2, the functions of the data transformation, such as the logic processing function, the sizing processing function, and the format transformation processing function are performed.

Figure 6:
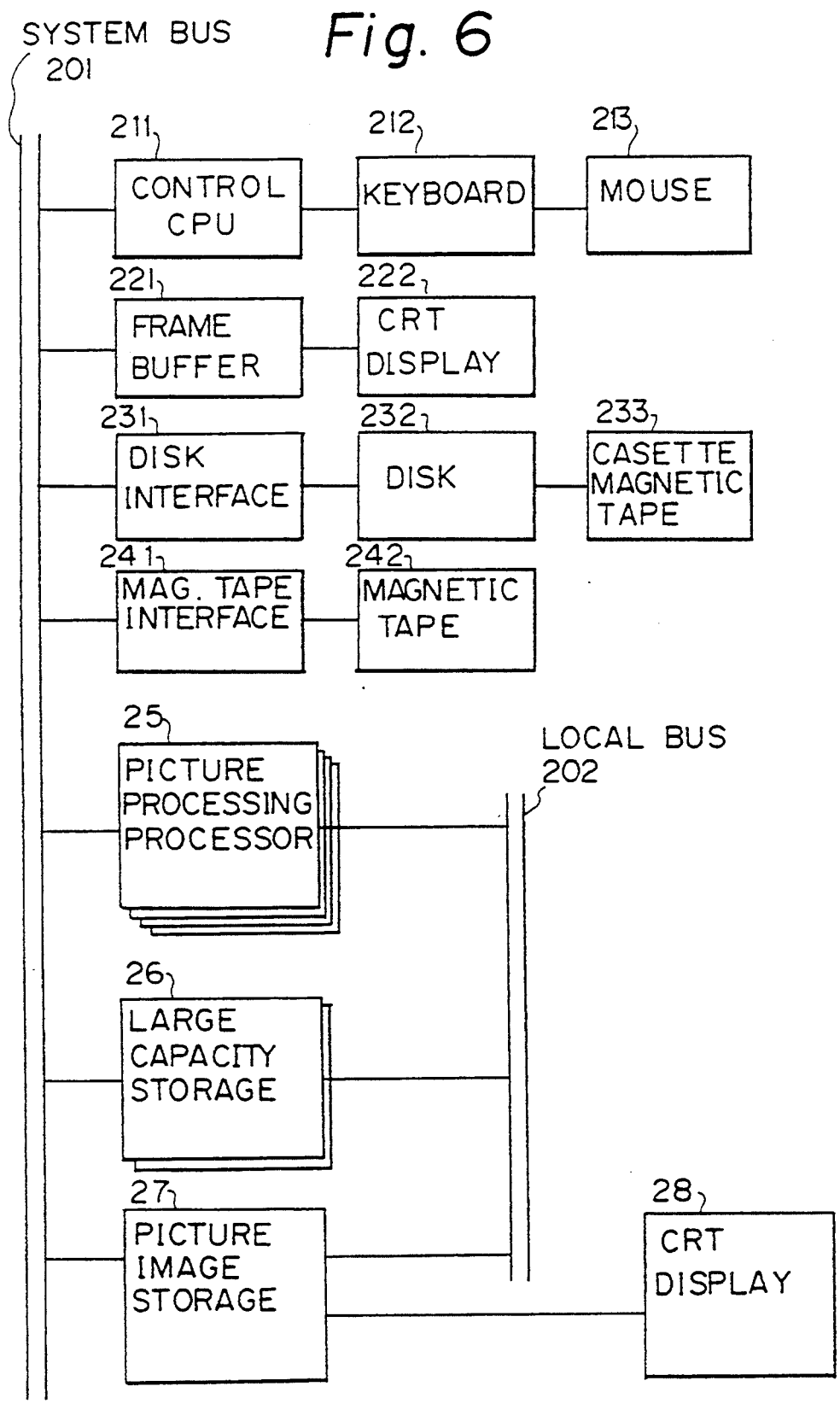
FIG. 6 shows the structure of the data transformation unit in the apparatus of FIG. 5.
Figure 7:
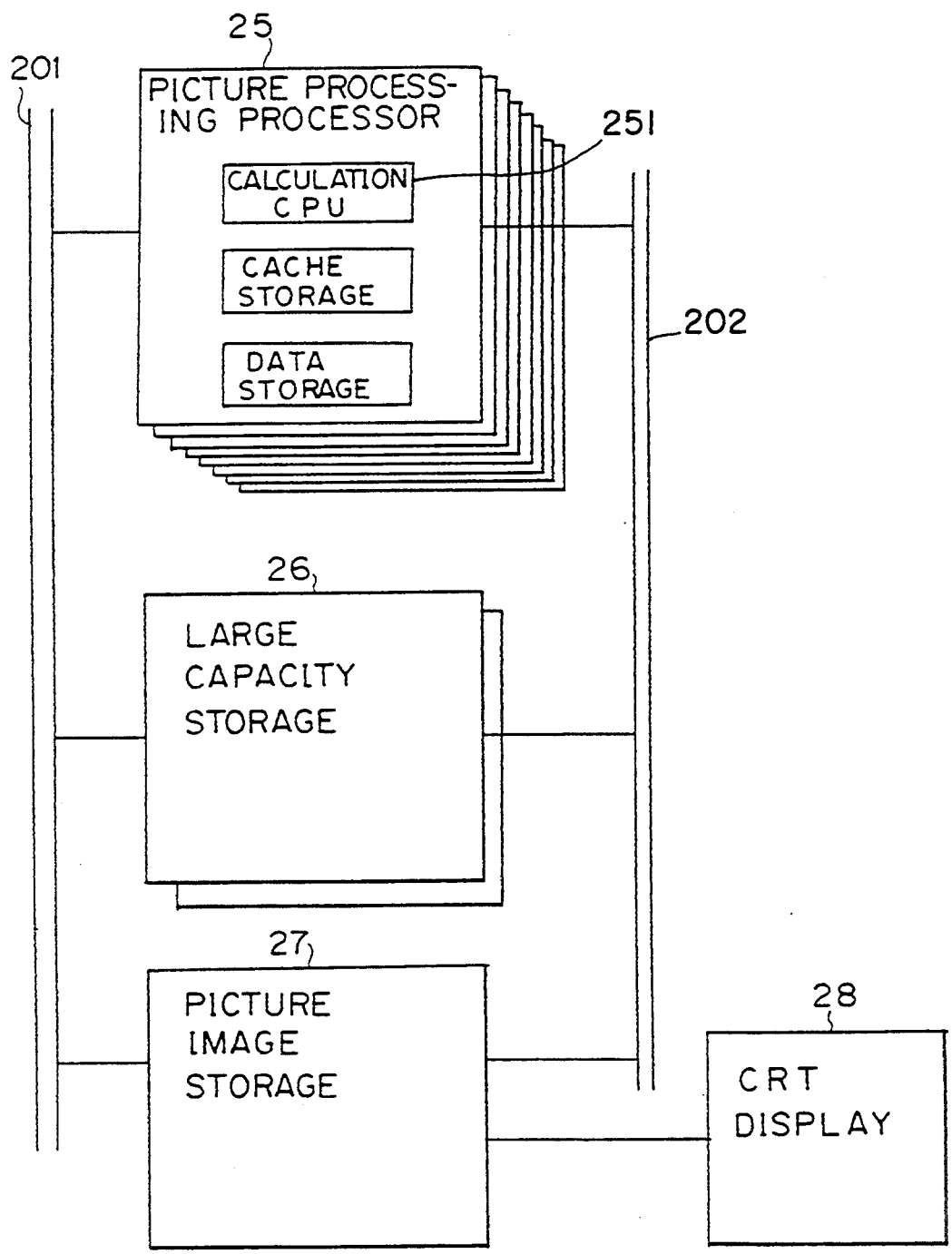
FIG. 7 shows the detailed structure of the picture processing processor in the unit of FIG. 6.

The data transformation unit 2 shown in FIG. 6 includes a system bus 201, a control central processor unit 211, a keyboard 212, a mouse 213, a frame buffer 221, a cathode ray tube display 222, a disk interface 231, a disk 232, a cassette magnetic tape 233, a magnetic tape interface 241, a magnetic tape 242, a picture processing processor 25, a large capacity storage 26, a picture image storage 27, a local bus 202, and a cathode ray tube display 28.

In the data transformation unit of FIGS. 6 and 7, the control of the mask data transformation is carried out by the control CPU 211. In the CPU 211, the processing is carried out to cause a plurality of picture processing processors 25 to be operated in parallel. The instructions of the operator are received by the control CPU 211. The processing of the control CPU 211 is converted to an image in the picture image circuit including the frame buffer 221, and the picture image formed in the picture image circuit is displayed by the CRT display 222.

In the disk 232, which comprises by a hard disk, the data necessary for the processing of the control CPU 211 is stored. The data is exchanged with the control CPU 211 through the disk interface 231 which uses the SCSI standard. The cassette magnetic tape 233 has a plurality of cassette magnetic tapes, and data which is greater in amount than the data of the disk 232 is exchanged with the magnetic tape 242 through the magnetic tape interface 241.

As shown in FIG. 7, the picture processing processor 25 comprises a calculation CPU 251, a cache storage 252 of, for example, 128 KB, and a data storage 253 of, for example, 16 MB. There are provided, for example, eight picture processors in all. In the calculation CPU 251, calculations processing, mainly for the picture processing, necessary for the mask data transformation are carried out. The necessary data is received from the cache storage 252. If the necessary data is not stored in the cache storage 252, data received from the data stored in the data storage 253.

Thus, in the data transformation unit of FIGS. 6 and 7, a hierarchical CPU arrangement is formed by the control CPU 211 and the calculation CPU 251.

In the data transformation unit of FIGS. 6 and 7, the large capacity storage 26 comprises a tertiary storage and has a capacity to store all picture data necessary for the mask data transformation in the form of evolved line segment information, for example a capacity of 64 MB. In all, there are provided, for example, two large capacity storages 26.

A hierarchical storage arrangement is formed by the cache storage 252, the data storage 253, and the large capacity storage 26, and access to these hierarchically arranged storages from the calculation CPU 251 is possible. Thus, reading and updating the content of the large capacity storage 26 by all of the picture processing processors 25 is possible.

The data storage 253 is constructed to be able to store at least the data for the field regions among the mask data of the actual integrated circuit device. The large capacity storage 26 is constructed to be able to store the data necessary for the production of the mask data of one layer of the actual integrated circuit device among the mask data of the actual integrated circuit device. The data storage 253 and the large capacity storage 26 are arranged to be able to transfer the picture data per unit of the field region therebetween. In the picture image storage 27, the picture image data necessary for displaying the processing of the picture processing processor 25 is stored, and the stored picture image data is displayed by the cathode ray tube display 28.

In the range scanning circuit 51, the CAD design data format is received, and the scanning as well as the mask data transformation are carried out, and data per region are successively supplied to the picture image storage 61. Also, in the range scanning circuit 51, the range designating information received from the range designating circuit 52 is supplied to the picture image storage 61.

In the picture image storage 61, the data of the range scanned by the range scanning circuit 51 is transformed into a picture image and this transformed picture image is stored. The transformed picture image stored in the picture image storage 61 is supplied to the video monitor 62.

In the range designating circuit 52, when the operator specifies a desired range while observing the display on the video monitor 62, a signal designating this range is generated, and the generated signal is supplied to the range scanning circuit 51.

In the logic function circuit 7, the picture image data is supplied from the picture image storage 61, the functions, for example, a logic processing function (FUNCTION-A), a sizing processing function (FUNCTION-B), a format transformation processing function (FUNCTION-Z), and the like, are provided, and the desired function selected by the operator is supplied to the picture image forming circuit 81.

In the picture image forming circuit 81, the processing of the supplied selected function is carried out, and the output thereof is supplied to the video monitor 82.

Figure 8:
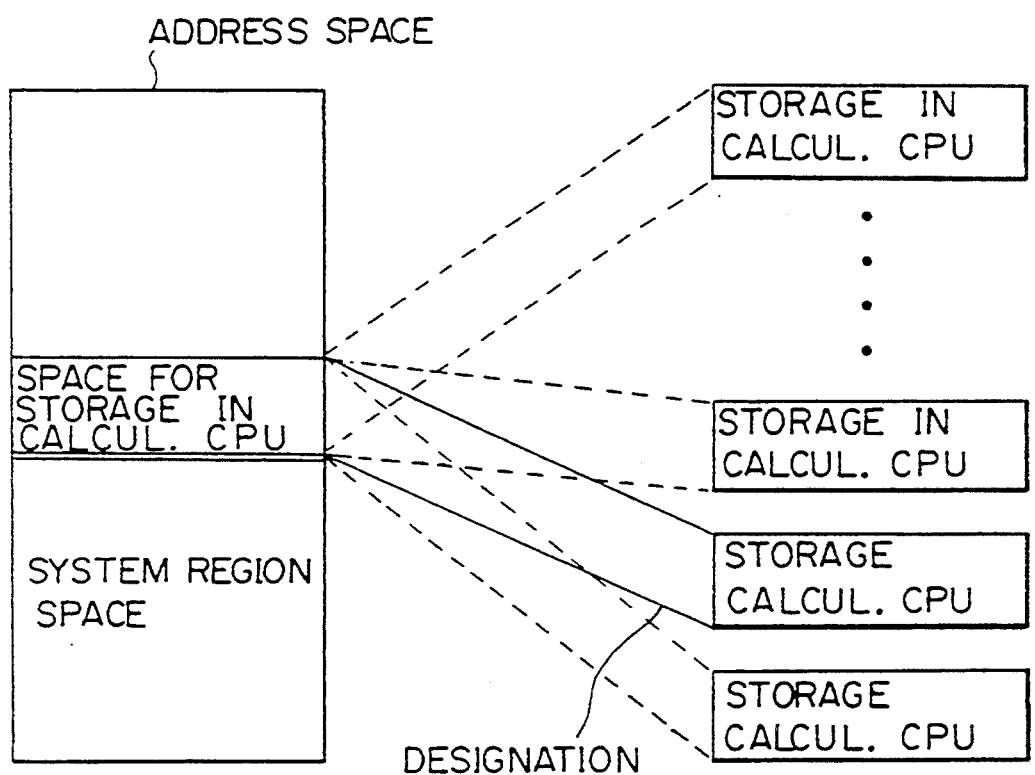
FIG. 8 illustrates an arrangement of the address space of a CPU in the data transformation unit.

An example of the arrangement of the address space of the control CPU in the data transformation unit is illustrated in FIG. 8. In the apparatus of FIG. 5, it is preferable that, in the address space of the control CPU, a space corresponding to the storage of one calculation CPU is established. As shown in FIG. 8, a space for the storage in the calculation CPU is secured in a portion of the address space of the control CPU other than the system region space. The mapping of one of the storages in the calculation CPU designated by a register in the control CPU is to be carried out in the space for the storage in the calculation CPU. Thus, the access to any of the storages in the calculation CPU by the space for the storage in the calculation CPU is possible.

Figure 9:
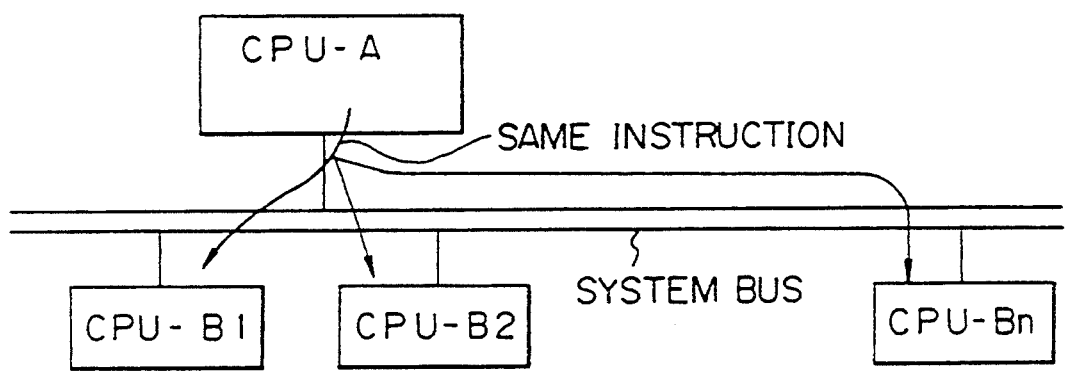
FIG. 9 illustrates a transmission of an instruction between CPU's.
Figure 10:
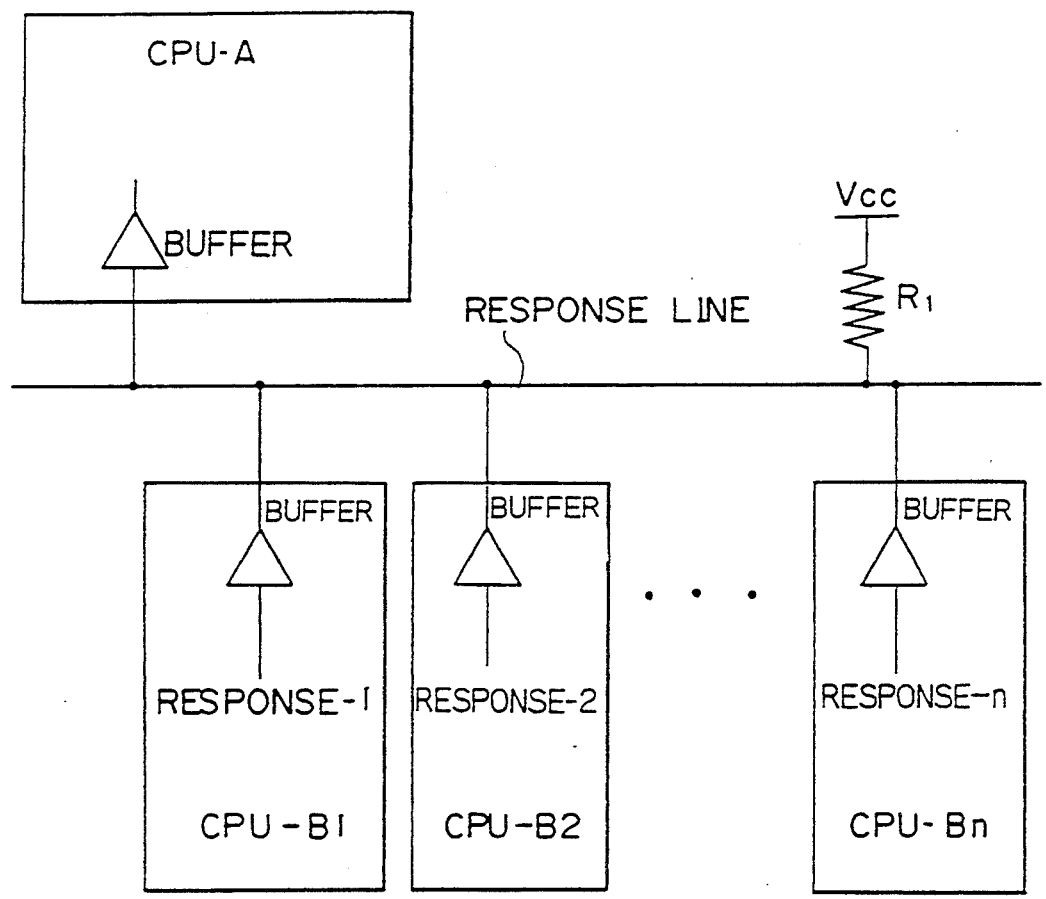
FIG. 10 illustrates a transmission of the instruction response between CPU's.
Figure 11:
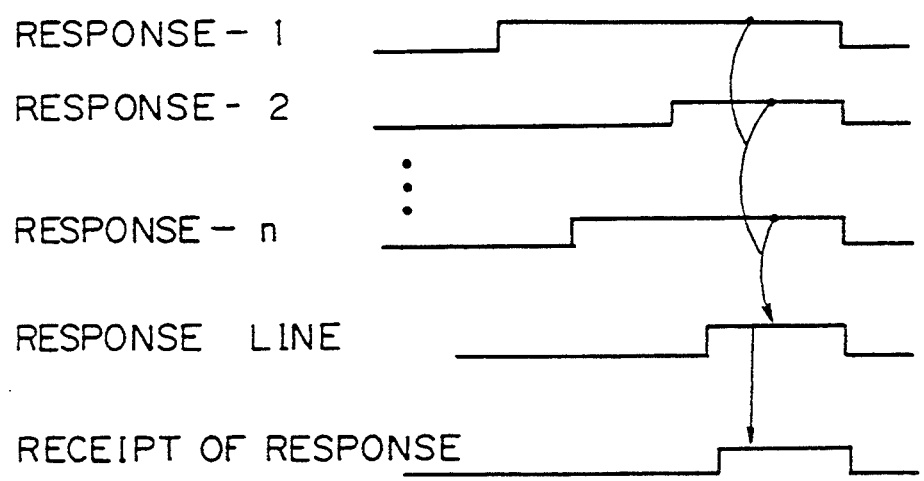
FIG. 11 illustrates changes of logic levels in the receipt of the instruction response.

An example of the operation of the instruction transmission and the response receipt in the upper level CPU-A in the data transformation unit of FIG. 6 and 7 is illustrated in FIGS. 9, 10 and 11.

When the same instruction, e.g., a sizing processing instruction, is transmitted from the upper level CPU-A to a plurality of the lower level CPU's -B1, -B2, . . . -Bn through the system bus, this same instruction is transmitted simultaneously in parallel as shown in FIG. 9. The responses to this instruction are transmitted from the lower level CPU's -B1, -B2, . . . -Bn to the upper level CPU-A with positive logic, through the response line as shown in FIG. 10. A pull-up resistor $R_1$ is connected between the voltage source Vcc and the response line. In the upper level CPU-A, "1" represents the existence of receipt of a response, and "0" represents the absence of receipt of a response.

The change in logic levels in the receipt of the instruction response are illustrated in FIG. 11. Only when all of the responses to the processing instruction of the upper level CPU-A are responses of positive logic, does the logic level of the response line become "1", and then the upper level CPU-A receives the response. This means that confirmation that the processing instruction from the upper level CPU-A is received simultaneously by all the lower level CPU's -B1, -B2, . . . -Bn. Since the time required for supplying the lower level CPU's -B1, -B2, . . . -Bn with the processing instruction is reduced, the data processing time is reduced, and thus the speed of the processing in the apparatus is increased. In consequence, the efficiency of the mask data transformation is enhanced, and the effect of the enhancement of efficiency is remarkable particularly when the number of the lower level CPU's is increased.

Figure 12A:
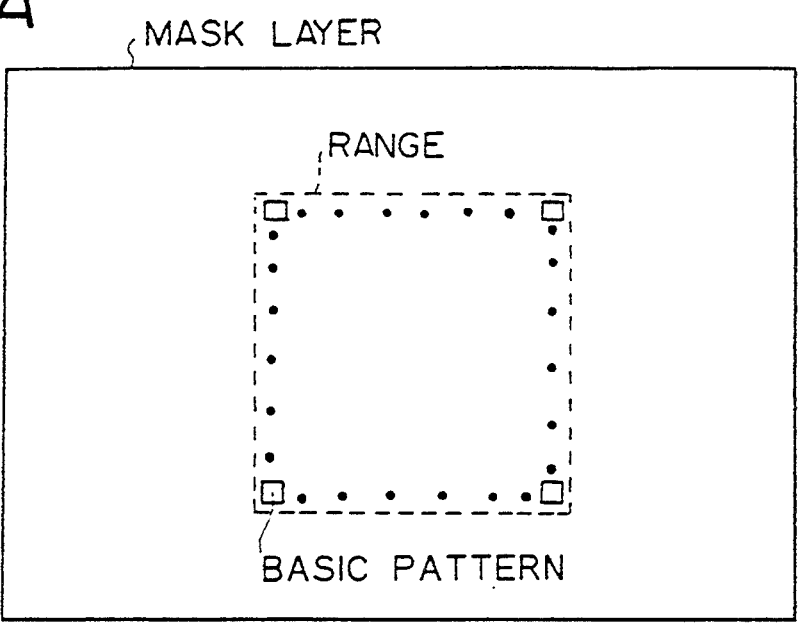
FIGS. 12A and 12B illustrate an example of the processing of the repetitive pattern.
Figure 12B:
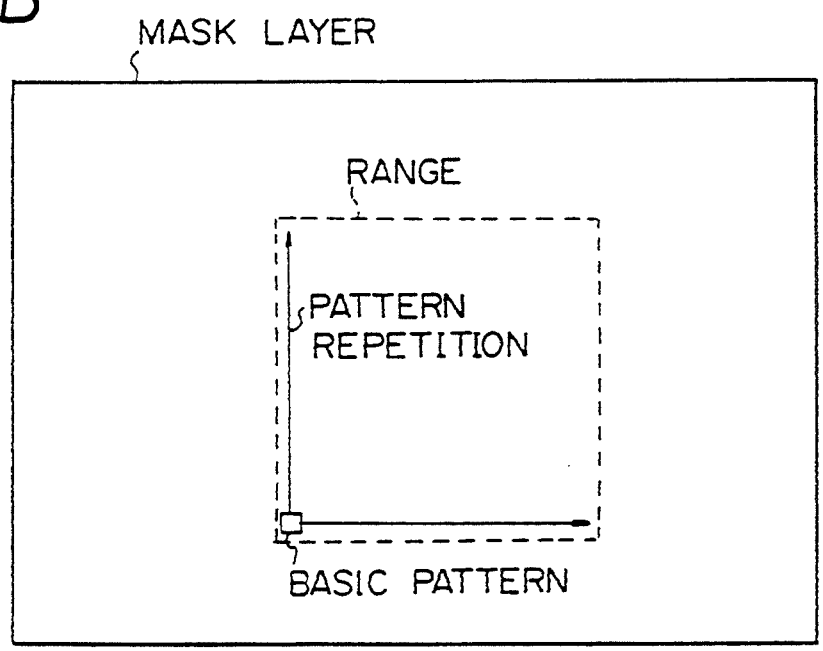

An example of the processing of the repetitive pattern is illustrated in FIGS. 12A and 12B. To produce mask patterns constituted by the repetition of a basic pattern shown in FIG. 12A, it is possible to use the process of the pattern repetition shown in FIG. 12B. In the process shown in FIG. 12B, the data of the single basic pattern, the data of the pitch along the abscissa and the ordinate, and the data of the number of 10 repetitions are used. For this processing, the data of the basic pattern is stored in the data storage 253, and the exchange of the data with the large capacity storage 26 is carried out. According to such processing, the required amount of data can be reduced to enable an improvement in the efficiency of data processing.

An example of the display of the rule menu for the operation of the picture image forming circuit in the apparatus of FIG. 5 is shown in FIG. 13.

We claim:

1. An apparatus for mask data processing in which a design data format, including a mask area having at least one unit field, of computer aided design for an integrated circuit is transformed into mask data of an actual integrated circuit, comprising:

a data transformation unit transforming the design data format of the computer aided design for the integrated circuit into the mask data of the actual integrated circuit, wherein said data transformation unit comprises:

a control central processor unit controlling the transformation of the design data format into the mask data, and a picture processing processor having a calculation central processor unit for at least one unit field processing the design data format, the picture processing processor being responsive to the control central processor unit, and the calculation central processor unit performing calculation processing for picture processing and for transforming the design data format into the mask data; and picture image display means for monitoring the transformation of the design data format into the mask data.

2. An apparatus for mask data processing according to claim 1, wherein said control central processor unit has an address space and the calculation central processor unit has storage, the address space corresponding to the storage of the calculation central processor unit.

3. An apparatus for mask data processing according to claim 1, wherein the picture processing processor, having a data storage, stores at least data for each unit field of the mask data.

4. An apparatus for mask data processing in which a design data format, including a mask area divided into unit fields, of computer aided design for integrated circuit is transformed into mask data of an actual integrated circuit, comprising:

a data transformation unit transforming the design data format of the computer aided design for the integrated circuit into the mask data of the actual integrated circuit, wherein said data transformation unit comprises:

a control central processor unit controlling the mask data transformation, and a plurality of picture processing processors each having a calculation central processor unit for each unit field, controlled by the control central processor unit and processing the design data format, wherein a processing instruction from the control central processor unit is supplied simultaneously to each of the picture processing processors and wherein the calculation central processor units perform calculation processing for picture processing and for transforming the design data format into the mask data; and picture image display means for monitoring the transformation of the design data format into the mask data.

5. An apparatus for mask data processing according to claim 1, wherein the picture processing processor, having a data storage, stores data with unit field of least repetitive data of the mask data of the actual integrated circuit.

6. An apparatus for mask data processing in which a design data format, including a mask area divided into unit fields, of computer aided design for an integrated circuit is transformed into mask data of an actual integrated circuit, and said apparatus for displaying picture image data to an operator, said apparatus comprising:

a data transformation unit transforming the design data format of the computer aided design for the integrated circuit into the mask data of the actual integrated circuit; and a picture image display unit monitoring the transformation of the design data format into the mask data, said picture image display unit being adapted to display in a video representation the transformation of the design data format into the mask data, and said picture image display unit comprising:

range designating circuit providing range designating information;

range scanning circuit receiving the design data format, receiving range designating information from the range designating circuit, and transforming the design data format into picture image data in accordance with the range designating information; and video monitor displaying picture image data from the range scanning circuit.

7. An apparatus for mask data processing in which a design data format, including a mask area divided into unit fields, of computer aided design for an integrated circuit is transformed into mask data of an actual integrated circuit, comprising:

a data transformation unit for transforming the design data format of the computer aided design for the integrated circuit into the mask data of the actual integrated circuit, wherein said data transformation unit comprises:

a control central processor for controlling the mask data transformation, and a plurality of pattern processing processors having calculation central processors and data storages for unit fields for processing patterns of the design data format, said control central processor and said pattern processing processors being separated and hierarchically arranged, said pattern processing processors being responsive to said control central processor, and each calculation central processor performing calculation processing for pattern processing and for transforming the design data format into the mask data; and pattern image display means for monitoring the transformation of the design data format into the mask data.

* * * * *